United States Patent
Tanaka

(10) Patent No.: US 6,289,470 B1
(45) Date of Patent: Sep. 11, 2001

(54) DATA MONITOR CIRCUIT

(75) Inventor: Toshiyuki Tanaka, Tokyo (JP)

(73) Assignee: Wilmington Trust Company, Wilmington, DE (US)

(*) Notice: Subject to any disclaimer, the term of this patent is extended or adjusted under 35 U.S.C. 154(b) by 0 days.

(21) Appl. No.: 09/192,593

(22) Filed: Nov. 17, 1998

(30) Foreign Application Priority Data

Feb. 4, 1998 (JP) .................................................. 10-023131

(51) Int. Cl.⁷ .................................................. G06F 11/00
(52) U.S. Cl. .................................................. 714/5; 711/100
(58) Field of Search ................................ 714/5, 25, 26, 714/27, 30, 32, 39, 41, 42, 47; 711/100, 104

(56) References Cited

U.S. PATENT DOCUMENTS

| | | | | |
|---|---|---|---|---|
| 3,579,199 | * | 5/1971 | Anderson et al. | 340/172.5 |
| 4,326,290 | * | 4/1982 | Davis et al. | 371/21 |
| 4,692,897 | * | 9/1987 | Crabbe, Jr. | 364/900 |
| 5,054,026 | * | 10/1991 | Tsubota | 371/68.3 |
| 5,263,143 | * | 11/1993 | Robinson et al. | 395/425 |
| 5,838,898 | * | 11/1998 | Sawai | 395/185.03 |
| 6,134,676 | * | 10/2000 | VanHuben et al. | 714/39 |
| 6,141,757 | * | 10/2000 | Seeker et al. | 713/200 |
| 6,158,028 | * | 12/2000 | Imura | 714/718 |

FOREIGN PATENT DOCUMENTS 2-105945   4/1990   (JP).

* cited by examiner

*Primary Examiner*—Nadeem Iqbal

(57) ABSTRACT

Address information that is desired to be monitored of a data storage memory is stored in a data memory address buffer 110, and while a program is being executed the stored address information and address information transferred to a bus are compared. If there is coincidence between the stored address information and the address information transferred to the bus, data that has been transferred to the bus (data that has been read or written based on coincident address information) can be reliably output to the outside. As a result, it is possible to reliably carry out defect analysis for a data storage memory while a program is being executed.

10 Claims, 4 Drawing Sheets

DATA MONITOR CIRCUIT

BACKGROUND OF THE INVENTION

1. Field of the Invention

The present invention relates to a memory circuit for storing data handled inside a microcomputer, for example, a data monitor circuit for specifying failures of a readable and writable random access memory (hereinafter referred to as a RAM), or an electrically erasable read only memory (hereinafter referred to as EEPROM) etc.

2. Description of the Related Art

Recently, the degree of integration and efficiency of microcomputers has been improving rapidly. Such a microcomputer is constructed by integrating various component elements on to a single integrated circuit chip (hereinafter simply called a chip). Particularly, the typical microcomputer structure has a central processing unit for carrying out operational control of each component element within the microcomputer, a first memory circuit, such as RAM or EEPPROM for storing data to be handled in the microcomputer, a second memory circuit, such as read only memory (hereinafter referred to as ROM) for storing program data for various processes of the microcomputer, and a bus for sending address information and data of the memory circuits.

In this type of microcomputer, failures occur in the internal memory for storing data. Analysis of these failures involves executing writing and reading of data to and from the memory, and specifying failed locations according to the state of the read data.

However, by only executing writing and reading of data to and from the memory for simply storing data, as described above, it takes time to find the failed locations, or failed locations can not be found. For example, when failures occur in a memory for storing data after execution of specified processing set within a program, the execution of that specified processing can also be the main cause of major failures. In this type of situation, it is better if a program for checking failed locations can be inserted within the program, and failed locations specified during execution of the program for reproducing the failure phenomenon.

However, a mask ROM is used in a ROM storing the program, and a checking program within the memory internal to a microcomputer, such as a one time program type microcomputer (hereinafter referred to as OTP) can not be updated. This means that a check program can not be inserted into the program, and there is a problem that failure analysis can not be performed.

An object of the present invention is to solve the above problems by reliably carrying out failure analysis during execution of a program.

A further object of the present invention is to reliably carry out failure analysis during execution of a program with a simple construction.

Another object of the present invention is to reliably carry out failure analysis during execution of a program at high speed.

A still further object of the present invention is to reliably carry out failure analysis during execution of a program, even under complex conditions.

SUMMARY OF THE INVENTION

At least reading of data from a first memory circuit is carried out via a bus according to a fixed program, and a data monitor circuit for monitoring data transferred on this bus comprises a first address storage circuit for storing information of an address of the memory circuit to be monitored, a first comparison circuit for receiving address information designated by a fixed program via a bus and detecting coincidence with address information stored in the first address storage circuit, a first data storage circuit for storing data being transferred on the bus, a first gate circuit for transferring data being transferred to the bus to the first data storage circuit in response to a first permission signal, and a control circuit for outputting the first permission signal according to a detection result of the first comparison circuit.

DETAILED DESCRIPTION OF THE PREFERRED EMBODIMENTS

Figure 1:
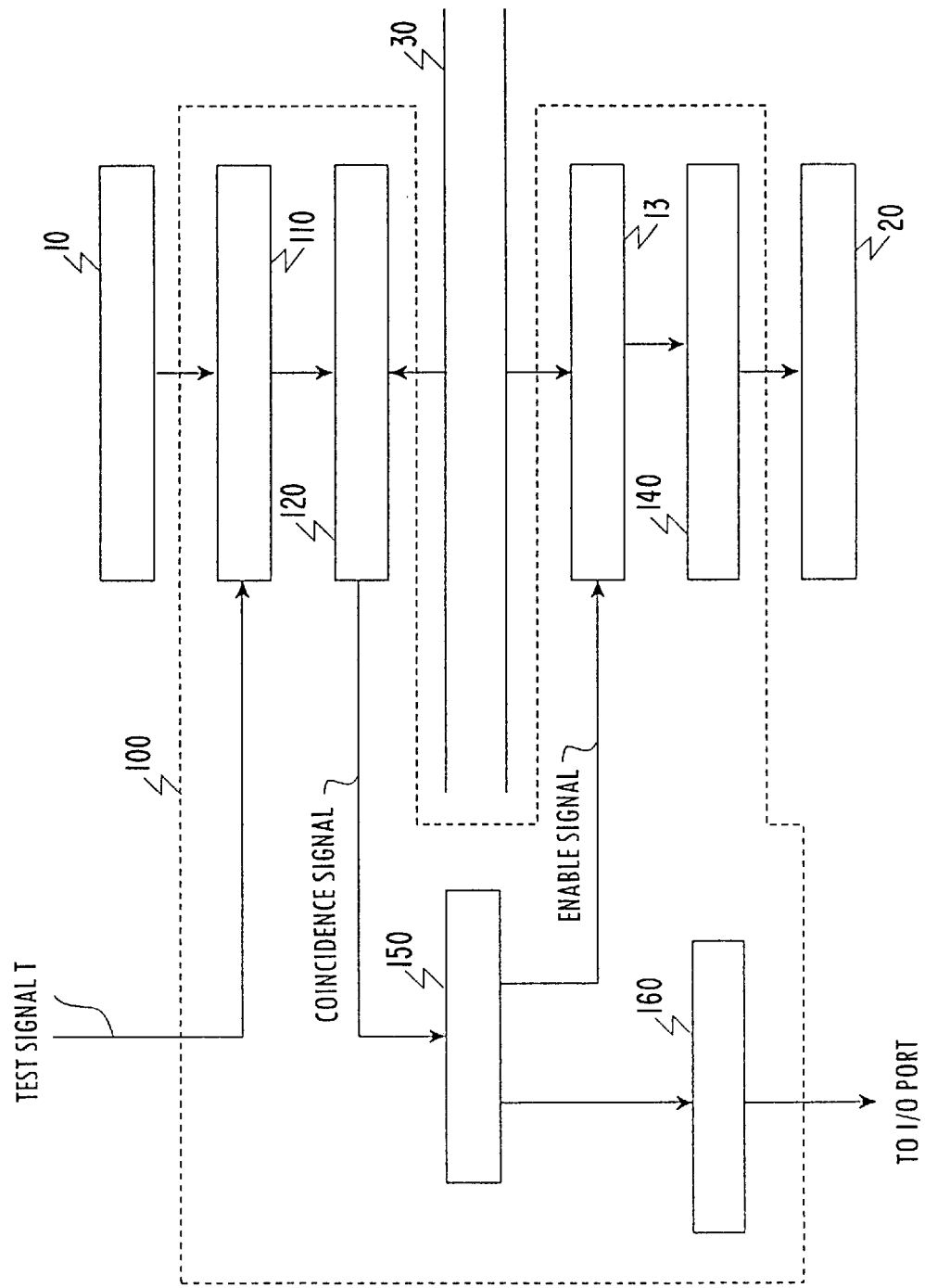
FIG. 1 is a circuit block diagram of a data monitor circuit 100 of a first embodiment of the present invention.

A data monitor circuit of the present invention will now be described in detail using the drawings. FIG. 1 is a circuit block diagram of a data monitor circuit 100 of a first embodiment of the present invention. The data monitor circuit 100 is embodied as a device internal to a microcomputer.

There are two cases for providing buses: In one case, a common bus is provided for transferring address information and data, and in the other case, an address bus for transferring address information and a data bus for transferring data are respectively provided. FIG. 1 shows the former case where transfers are carried out on the common bus. With respect to the case where the address bus and data bus are respectively provided, if it is considered that address information is transferred on the address bus and data is transferred on the data bus, it goes without saying that the present invention is applicable to both cases.

In FIG. 1, reference numerals 10 and 20 are input output ports commonly used for sending and receiving data etc. between component elements inside the microcomputer (for example the data monitor circuit 100) and external components. The input output port 10 can be an input port used only for receiving data etc. and the input output port 20 can be an output port used only for transmitting data etc. in the present invention. A first embodiment of the present invention shows that if an input output port is used, the present invention can be applied to a microcomputer having a reduced number of terminals.

Also, in FIG. 1, reference numeral 30 is a bus, and has been described above is for commonly transferring address information and data, but it is also possible to respectively provide an address bus for transferring address data and a data bus for transferring data.

Next, the data monitor circuit 100 will be described in detail. The data monitor circuit 100 is comprised of a data memory address buffer 10, constituting a first address storage circuit, an address comparator 120, being a first comparator circuit, an output gate 130, constituting a first gate circuit, a data buffer 140, being a first data storage circuit, a controller 150, constituting a control circuit, and a completion flag section 160 constitution an instruction information storage section.

When test is instructed by a test signal T (for example, a high level signal), address information (address information of the memory for storing data will be called data memory address) of an address of the memory for storing data, not shown, internal to the microcomputer, that is to be monitored, is input from the input output port 10 to the data memory address buffer 110. The data memory address buffer 110 stores and outputs this input address information. When the test signal T does not designate test (for example, a low level signal), a signal input from the input output port 10 is not stored in the data memory address buffer 110.

The address comparator 120 compares address information transferred onto the bus 30 during execution of a program and address information stored in the data memory address buffer 110, and detects coincidence between the two. The result of detection is transferred to the controller 150 as a coincidence signal. The coincidence signal, for example, indicates that the detected result is no coincidence when at a low level, or that the detection result is coincidence when at a high level.

The controller 150 outputs an enable signal, being a first permission signal, in response to a coincidence signal from the address comparator 120. For example, if the coincidence signal is high level, the enable signal becomes high level, while if the coincidence signal is low level the enable signal becomes low level.

The controller 150 sets the completion flag section 160 in response to a high level coincidence signal. Here, set means setting a flag that has an initial condition of "0" to "1". Reset of the completion flag section 160 (resetting to the initial condition of "0") is carried out, for example, in response to the test signal T becoming high level. The flag condition of the completion flag section 160 is output so that it can be confirmed from an external terminal, for example, one terminal of the input output port.

The output gate 130 makes it possible to transfer data that has been transferred onto the bus to the data buffer 140 in response to a high level enable signal. Specifically, when the enable signal is at a low level, data that has been transferred onto the bus is not transferred to the data buffer 140.

The data buffer 140 stores data that has been transferred through the output gate 130, and outputs it to the input output port 20. The stored contents of the data buffer 140 are preferably initialized (to information that has no effect on normal operation) by receiving a high level test signal T.

The operation of the data monitor circuit 100 constructed in this way will be described below.

When the microcomputer is operating normally, the test signal T is at a low level, and information of an address to be monitored is not stored in the data memory address buffer 110 (or invalid address information not designated in normal operation is stored). As a result, a coincidence signal of the address comparator 120 is always at a low level. Accompanying this, an enable signal of the controller 150 is set to a low level. As a result, there is no transfer of data from the output gate 130 to the data buffer 140. The input output port 10 and input output port 20 can carry out sending and receiving of data during normal operation, without being affected by the data monitor circuit 100. At this time, the completion flag also remains at "0", and is not changed. If there is also a terminal indicating the condition of the flag of the completion flag section 160 at one input/output port, there is no problem since sending and receiving of signals at that input/output port is given priority.

Next, description will be given for the case where the condition of specified address values in the memory for storing data is monitored in order to analyze defects.

A test signal T is set to a high level, and memory cell address information of the address of the memory for storing data that is to be monitored is input from the input output port 10. This address information is stored in the data memory address buffer 110. At this time, the completion flag section 160 is also reset to an initial state of "0".

In this state, the test signal T is returned to a low level, and similarly to the normal operation, an internal program is executed and the microcomputer operates. With progression of the program, data is read from and written to the memory for storing data, which is the subject of monitoring. At this time, address information has been transferred to the memory for storing data via a bus when reading or writing is carried out, and so the address comparator 120 compares this address information with address information stored in the data memory address buffer 110.

When the address comparator 120 detects coincidence of address information in this comparison, a high level coincidence signal is output from the address comparator 120. The controller 150 sets an enable signal to high level in response to the high level coincidence signal. In response to the enable signal going high level, the output gate 130 transfers data that has been transferred to the bus and written to the data storage memory (or data that has been read) to the data buffer 140, based on the coincident address information. This data is stored in the data buffer 140, and output to the input output port 20. At this time, the controller 150 sets the flag for the completion flag section 160 to "1" in response to receipt of the high level coincidence signal. While the address comparator 120 is detecting lack of coincidence, the coincidence signal and the enable signal remain at a low level, and the completion flag section 160 also keeps the flag at "0".

In this way, by confirming that the flag of the completion flag section 160 has become "1", it is possible to know immediately when an access for address information to be monitored has been made to the data storage memory. Also, by confirming the information output from the input output port 20, it is possible to know the data that has been written (or read) to the memory cell of that address information.

As has been described above, using the data monitor circuit 100 of the first embodiment of the present invention, without modifying a program housed in the microcomputer, it is possible monitor data for specified address information of a memory that is the object of monitoring while that program is being executed.

As has been described above, the first embodiment of the present invention does not significantly increase the number of structural elements of a data monitor circuit, and does not have complicated control, which means that it can be simply applied, and even if this data monitor circuit is built in, there is no increase in chip size.

Figure 2:
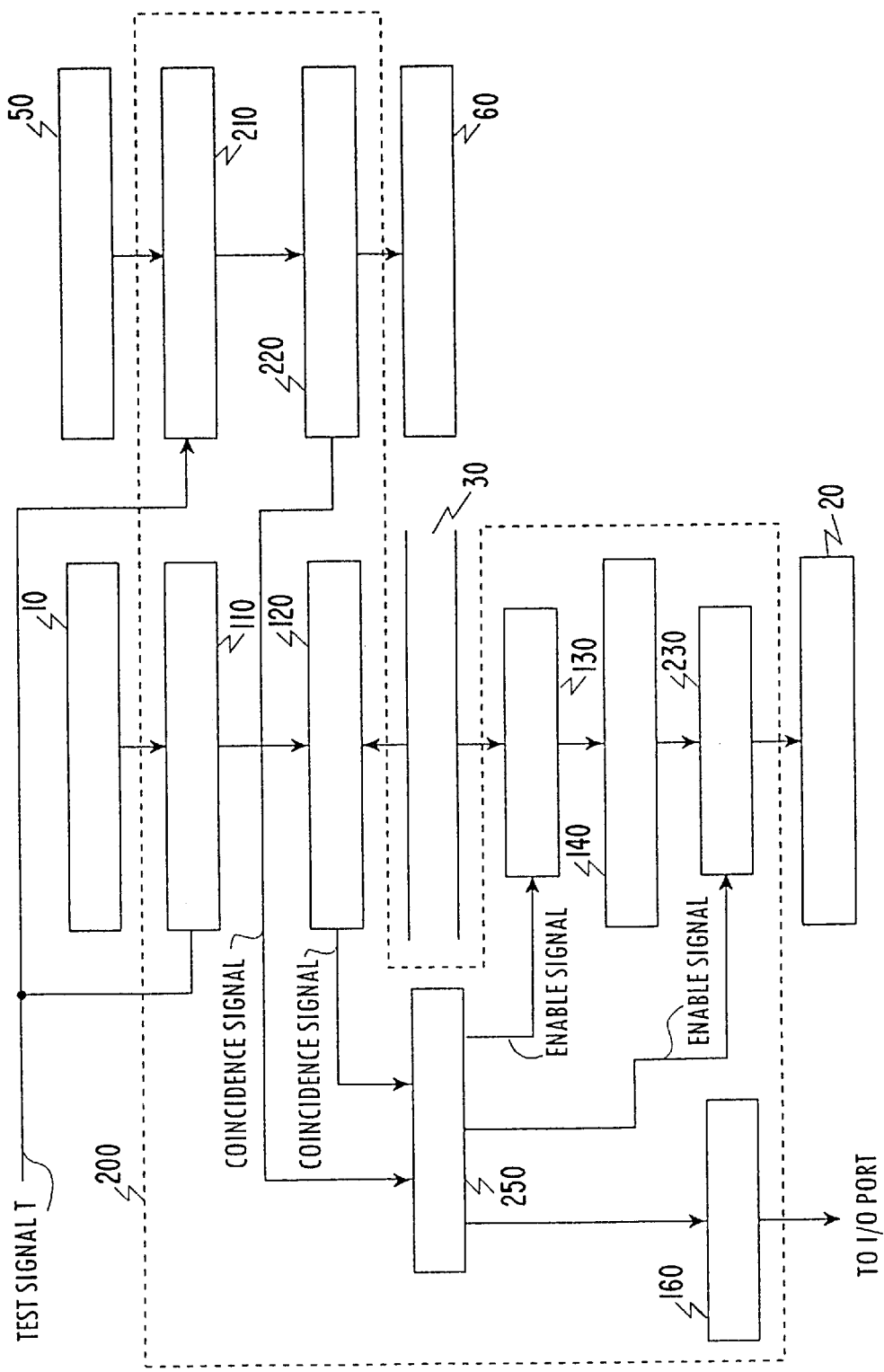
FIG. 2 is a circuit block diagram of a data monitor circuit 200 of a second embodiment of the present invention.

Next, a data monitoring circuit of a second embodiment of the present invention will be described using the drawings. FIG. 2 is a circuit diagram of a data monitoring circuit 200 of a second embodiment of the present invention. In FIG. 2, the same reference numerals are attached to parts that are the same as those of FIG. 1.

The feature of FIG. 2 is that the data monitoring circuit 200 additionally comprises a program memory address buffer 210, constituting a second address storage circuit, an address comparator 220, constituting a second comparison circuit, and an output gate 230, constituting a second gate circuit, and has a control section 250 modified according to these additional components.

When test is instructed by a test signal T (for example, a high level signal), the program memory address buffer 210 inputs address information to be monitored of the memory for storing program data, not shown, housed in the microcomputer, from an input output port 50 provided in the microcomputer (the address information of the memory for storing a program is also called program memory address). The program memory address buffer 210 stores the input address information and outputs it.

The address comparator 220 compares the address information stored in the program memory address buffer 210 and the address information indicated by the program counter 60, and detects coincidence. The program counter 60 is used when a program is executed, and indicates address information, in the memory for storing the program, where a process to be executed is stored. The result of detection of coincidence between the two addresses is transferred to the control section 250 as a coincidence signal. If the coincidence signal is a low level, for example, the detection result indicates lack of coincidence, while if the coincidence signal is a high level the detection result indicates coincidence.

The control section 250 also functions to output an enable signal, being a first permission signal, in response to the coincidence signal from the address comparator 120, and outputs an enable signal being a second permission signal in response to a coincidence signal from the address comparator 220. When the coincidence signal from the address comparator 220 is, for example, a high level (coincidence detected) the enable signal that is the second permission signal becomes a high level, and when the coincidence signal is low level (lack of coincidence detected) the enable signal becomes a low level.

When both the address comparator 120 and the address comparator 220 detect coincidence (when a high level signals have been received as the respective signals output from the address comparator 120 and the address comparator 220), the control section 250 sets the flag of the completion flag section 160 to "1".

When the enable signal that is the second permission signal (that is, the enable signal corresponding the coincidence detection by the address comparator 220) is a high level, the output gate 230 outputs the data stored in the data buffer 140 to the input output port 20. That is, when the enable signal that is the second permission signal is a low level, the address comparator 220 does not output data that has been stored in the to the input output port 20.

Operation of the data monitoring circuit 200 having the above construction will be described in the following.

When the microcomputer is operating normally, the test signal T is a low level, and address information to be monitored is not stored in the data memory address buffer 110 and the program memory address buffer 210 (or alternatively, not specified invalid address information is stored). As a result, the coincidence signals of the address comparator 120 and address comparator 220 are respectively always at a low level. This in turn means that the two enable signals of the control section 250 become low level. Accompanying this, there is no transfer of data from the output gate 130 to the data buffer 140, and also data of the data buffer 140 is not transferred from the output gate 230 to the input output port 20. It is thus possible to carry out normal sending and receiving of data during normal operation, without being affected by the data monitoring circuit 200. At this time, the completion flag also remains at "0" and is not changed. This means that even if a terminal indicating the flag condition of the completion flag section 160 is at one input output port, sending and receiving of signals at that input output port is given priority so there is no problem.

Next, description will be given for the case where the condition of specified address values in the memory for storing data is monitored in order to analyze defects when a specified process is executed.

The test signal T is set to a high level, address information of an address value that is desired to be monitored is input from the input output port 50, and this address information is stored in the data memory address buffer 110. Under the condition that a specified process is being executed, address information of the program storage memory where the specified process is stored is similarly input from the input output port 50. This address information is stored in the program memory address buffer 210. At this time, the completion flag section 160 is also reset to the initial condition of "0".

In this state, the test signal T is returned to a low level, and similarly to the normal operation an internal program is caused to execute and the microcomputer is operated. With progression of the program, data is read from and written to the data storage memory which is the subject of monitoring. At this time, address information has been transferred to the memory for storing data via a bus when reading or writing is carried out, and so the address comparator 120 compares this address information with address information stored in the data memory address buffer 110. Similarly, comparison of address information indicated by the program counter 60 and address information stored in the program memory address buffer 210 is carried out in the address comparator 220.

In these comparisons, when the address comparator 120 detects coincidence of address information a high level coincidence signal is output. The controller 250 sets an enable signal for the output gate 130 to a high level in response to the high level coincidence signal. In response to the enable signal becoming a high level, the output gate 130 transfers data that has been transferred to the bus and written to the data storage memory (or data that has been read) to the data buffer 140, based on the coincident address information. However, when the address comparator 220 does not detect coincidence of address information, a high level enable signal making it possible for the output gate 230 to transfer data is not supplied from the control section 250 (that is, the enable signal supplied to the output gate 230 remains at a low level). As a result, data stored in the data buffer 140 is not output to the input output port 20. The completion flag section 160 also maintains the flag at "0". That is, unless the address comparator 220 detects coincidence, the contents of the data buffer 140 are updated each time the address comparator 120 detects coincidence.

Next, if the address comparator 220 has detected coincidence of address information, a high level coincidence signal is output from the address comparator 220. The control section 250 sets an enable signal for the output gate 230 to a high level in response to the high level coincidence signal. In response to this enable signal, the output gate 230 outputs data stored in the data buffer 140 at this time to the input output port 20. At this time, the control section 250 sets the flag for the completion flag section 160 to "1" in response to the coincidence signals of the two address comparators 120 and 220 respectively becoming high level.

In this way, in the data monitoring circuit 200 of the second embodiment of the present invention, it is possible to monitor data that has been written to and read from particular address information of a memory to be monitored until a specified process is executed, which means that it is possible to monitor under more restricted conditions. Accordingly, analysis of defects can be carried out more reliably and in a shorter time.

Also, compared to the first embodiment, there are no significant additions to the construction, and there is no complicated control, which means that there is no increase in chip size.

Figure 3:
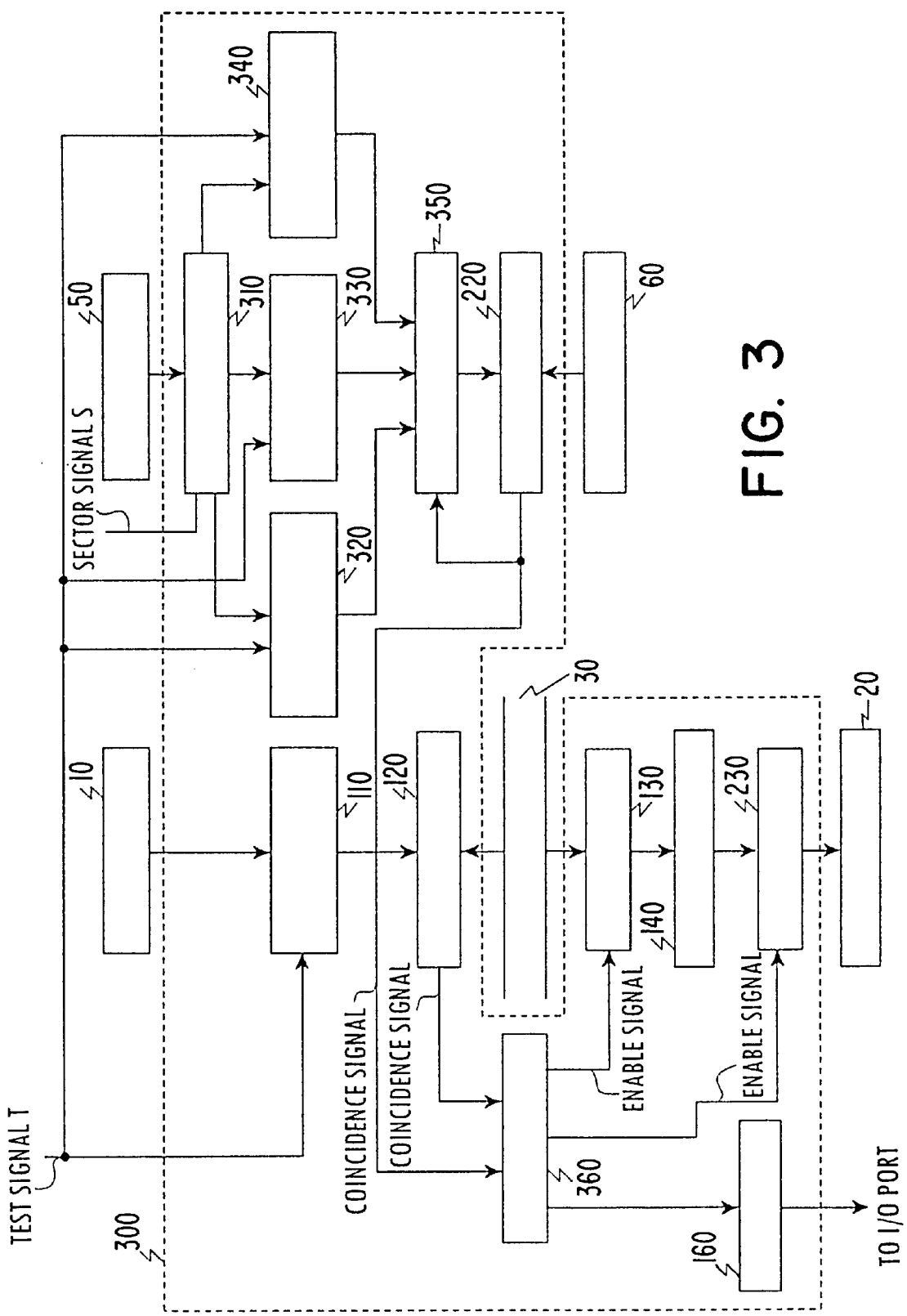
FIG. 3 is a circuit block diagram of a data monitor circuit 300 of a third embodiment of the present invention.

Next, a data monitoring circuit of a third embodiment of the present invention will be described using the drawings. FIG. 3 is a circuit diagram of a data monitoring circuit 300 of the third embodiment of the present invention. In FIG. 3, parts that are the same as those in FIG. 2 have the same reference numerals attached thereto.

The feature of the third embodiment in FIG. 3 is that an address buffer selector 310, constituting a first selector circuit, a plurality of program memory address buffers 320, 330 and 340 constituting a second address information circuit as a duplicate storage section (in FIG. 3 there are three, in order to simplify the description), and an address buffer selector 350, constituting a second selector circuit, are added to the structure of the data monitor circuit, and there is also a control section 360 modified in accordance with these additional components.

The address buffer selector 310 sequentially selects one of the program memory address buffers 320, 330 and 340 using a select signal S, and outputs address information to be monitored of a program memory, not shown, housed in the microcomputer, input from the input output port 50, to the one program memory address buffer that has been selected. If a signal having two-bit information, for example, is used as the select signal S it is possible to select 3 program memory address buffers, but this is not limiting. For example, if the select signal S is a one-bit signal, like a clock signal, the selected object can be switched depending on a number of pulses. In this case, it is possible to use the test signal T in place of the select signal S.

When the program memory address buffers 320, 330 and 340 are instructed to test by a respective test signal T (for example, a high level signal), address information to be monitored of a program memory, not shown, housed in the microcomputer is input from the input output port 50 through the address buffer selector 310. Each of the program memory address buffers 320, 330 and 340 respectively stores this input address information, and outputs the information. At this time, the address information to be monitored is sequentially stored in the program memory address buffers 320, 330 and 340, in order of highest priority.

The address buffer selector 350 selects one of the program memory address buffers 320, 330 and 340 in order and address information output from the selected program memory address buffer is output to the address comparator 220. As an initial state, the address buffer selector 350 selects, for example, the program memory address buffer 320 with the test signal T at a high level. For every coincidence signal from the address comparator 220 the address buffer selector 350 selects the program memory address buffers 330 and 340 in order.

For the output gate 130, the control section 360 outputs an enable signal to the output gate 130 under similar conditions to the second embodiment, but for the output gate 230 when a high level coincidence signal has been received three times from the address comparator 220 (namely, when coincidence has been detected for address information respectively stored in the three program memory address buffers 320, 330 and 340), an enable signal for the output gate 230 is set to high level (that is, it is made possible to output data stored in the data buffer 140 to the input output port 20).

This control section 250 in the second embodiment may be used in place of the control section 360 with the above described operation of the control section 360 provided in the address comparator 220. In this case, whenever the address comparator 220 detects coincidence, it updates the object to be selected in the address buffer selector 350 using a coincidence signal, separate from the coincidence signal to be transferred to the control section 250. When coincidence is detected for in address information stored in the three program memory address buffers, the address comparator 220 transfers a high level coincidence signal to the control section 250.

The operation of the data monitoring circuit 300 having the above described construction will now be described.

When the microcomputer is operating normally, the test signal T is low level, and address information to be monitored is not stored in the data memory address buffer 110 and at least the initially selected program memory address buffer 320 (or, in normal operation, unspecified invalid data is stored). As a result, similarly to the second embodiment, there is no transfer of data from the output gate 130 to the data buffer 140, and there is also no transfer of data in the data buffer 140 from the output gate 230 to the input output port 20. The input output ports 10, 20 and 50 can carry out sending and receiving of data in normal operation without being affected by the data monitoring circuit 300. At this time, the completion flag also remains at "0" and does not change. As a result, even if a terminal indicating the flag condition of the completion flag section 160 is at one input output port, sending and receiving of signals at that input output port is given priority so there is no problem.

Next, description will be given for the case where the condition of specified address values in the memory for storing data is monitored in order to analyze defects when a specified process is executed, after the execution of a few fixed processes.

First of all, the test signal T is set to a high level, address information of a memory cell to be monitored of the data storage memory is input from the input output port 10, and this address information is stored in the data memory address buffer 110. Similarly, under the condition that, after the execution of a few fixed processes (for example, first of all under a condition where execution of a first process has high priority, and next a condition where execution of a second process after execution of the first process has a next priority) after a specified process (for example, a third process after a first process and a second process have been sequentially executed) has been executed, address information of a program storage memory where a first process is stored is first of all input from the input output port 50 and this address information is stored in the program memory address buffer 320. Next, address information of the program storage memory where a third process is stored is input, and this address information is stored in the program memory address buffer 340. It is possible to realize this storage using the above described operation of the address buffer selector 310. At this time, the completion flag section 160 is also reset to the initial state of "0".

In this state, the test signal T is returned to a low level, and similarly to the normal operation an internal program is executed to operate the microcomputer. With progression of the program, data is read from and written to the data storage memory, which is the subject of monitoring. At this time, when reading or writing is carried out to or from the memory for storing data address information is transferred via a bus, and the address comparator 120 compares this address information with address information stored in the data memory address buffer 110. Similarly, comparison of address information indicated by the program counter and address information stored in the program memory address buffer 320 that is initially selected by the address buffer selector 350 is carried out in the address comparator 220.

In these comparisons, when the address comparator 120 detects coincidence of address information a high level coincidence signal is output. The controller 360 sets an enable signal for the output gate 130 to high level in response to the high level coincidence signal. In response to the enable signal going high level, the output gate 130 transfers data that has been transferred to the bus and written to the data storage memory (or data that has been read) to the data buffer 140, based on the coincident address information. However, when the address comparator 220 does not detect coincidence of address information, a high level enable signal making it possible for the output gate 230 to transfer data is not supplied from the control section 360 (that is, the enable signal supplied to the output gate 230 remains at a low level). As a result, data stored in the data buffer 140 is not output to the input output port 20. The completion flag section 160 also maintains the flag at "0". That is, unless the address comparator 220 detects coincidence, the contents of the data buffer 140 are updated each time the address comparator 120 detects coincidence.

Next, if the address comparator 220 has detected coincidence of address information, a high level coincidence signal is output from the address comparator 220. The high level coincidence signal is transferred to the control section 360. The control section 360 memorizes receipt of the first coincidence signal from the address comparator 220. In this case, the control section 360 keeps the enable signal for the output gate 230 at a low level. The output gate 230 does not output data stored in the data buffer 140 at this time to the input output port 20. In response to coincidence detection by the address comparator 220, the address buffer selector 350 switches address information transferred to the address comparator 220 to the address information stored in the program memory address buffer 330.

The address comparator 220 commences coincidence detection again, and until coincidence is detected for address information stored in all of the program memory address buffers 320, 330 and 340, the contents of the data buffer 140 are updated each time the address comparator 120 detects coincidence.

This type of coincidence detection by the address comparator 220 is carried out sequentially for the program memory address buffers 320, 330 and 340 by switching the subject program memory address buffer every time coincidence is detected.

Next, when the address comparator 220 detects coincidence for the address information stored in the program memory address buffer 340 after coincidence has already been detected for the program memory address buffers 320 and 330, a high level coincidence signal is output from the address comparator 220. The high level coincidence signal is input to the control section 360. A high level coincidence signal output from the address comparator 220 at this time is the third occurrence of coincidence, and so the control section 360 sets an enable signal for the output gate 230 to a high level. In response to the high level of the enable signal, the output gate 230 outputs data stored in the data buffer 140 a this time to the input output port 20. At this time, in response to a coincidence signal of the address comparator 120 becoming high level and the coincidence signal of the address comparator 220 becoming high level three times, the control section 360 sets the flag for the completion flag section 160 to "1".

In this way, with the data monitoring circuit 300 of the third embodiment of the present invention, after the execution of a few fixed processes and until a specified process is executed, it is possible to output data written to or read from specified address information of a memory to be monitored, which makes it possible to carry out monitoring under more limited conditions (conditions depending on the process). Accordingly, defect analysis can be carried out more reliably and in a shorter time.

Also, compared to the second embodiment, there is no significant addition to the structure and no complicated control, so there is no increase in the chip size.

Figure 4:
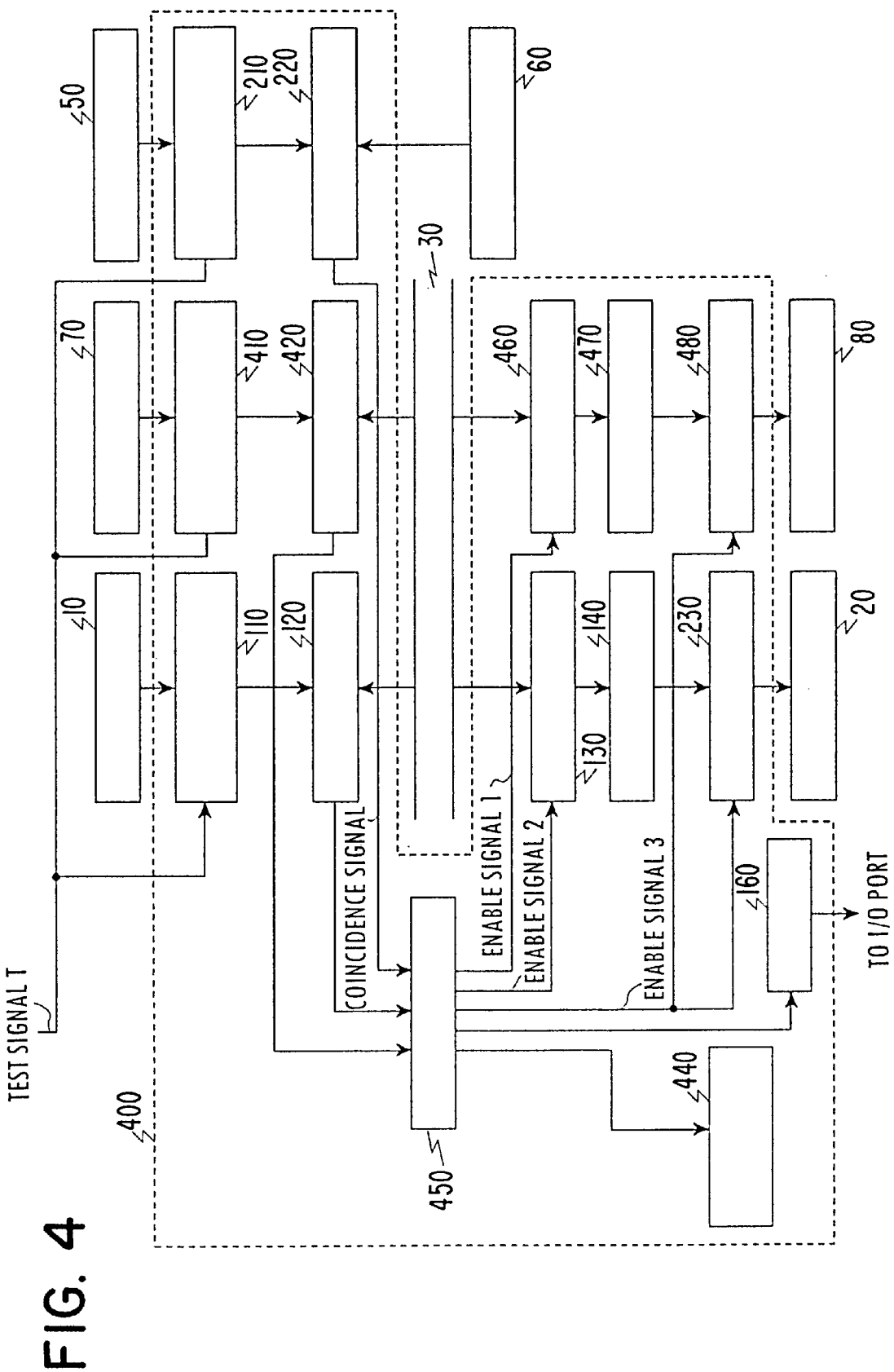
FIG. 4 is a circuit block diagram of a data monitor circuit 400 of a fourth embodiment of the present invention.

Next, a data monitor circuit of a fourth embodiment will be described using the drawings. FIG. 4 is a circuit diagram of the data monitoring circuit 400 of the fourth embodiment. In FIG. 4, parts that are the same as in FIG. 2 have the same reference numerals attached thereto.

The feature of FIG. 4 is that compared to the data monitoring circuit 200 of FIG. 2, a data memory address buffer 410, an address comparator 420, an output gate 460, a data buffer 470, an output gate 480 and a data buffer valid flag section 440 are added, and there is also a control section 450 modified in accordance with these additional components.

The data memory address buffer 410 has the same function as the data memory address buffer 110, and stores address information to be monitored of the data storage memory that is input from the input output port 70.

The address comparator 420 has the same function as the address comparator 120, and compares the address information stored in the data memory address buffer 410 with the address information transferred to the bus to detect coincidence.

The control section 450 outputs respectively corresponding high level enable signals in response to coincidence detection by the address comparators 120 and 420 (output of respective high level coincidence signals from each of the address comparators when coincidence is detected). When the address comparators 120 and 420 are detecting lack of coincidence (outputting low level coincidence signals), the control section 450 outputs respective low level enable signals.

The control section 450 transfers information indicating a coincidence detection condition (only address comparator 120 detects coincidence, only address comparator 420 detects coincidence, both address comparators detect coincidence, or both address comparators detect lack of coincidence) of the address comparators 120 and 420 to the data buffer valid flag section 440. This information is preferably at least two-bit information. When the address comparator 220 detects coincidence, transfer of this information is from the control section 450 to the data buffer valid flag section 440. The contents of the data buffer valid flag section 440 are initialized by the test signal T (to "00", for example) and output from an external terminal of the microcomputer, for example an input output port.

The output gate 460 has the same function as the output gate 130, and outputs data transferred to the bus to the data buffer 470 in response to a high level enable signal output from the control section 450 in response to detection of coincidence by the address comparator 420. That is, when a low level enable signal indicates that the address comparator 420 is detecting lack of coincidence, data transferred to the bus is not output to the data buffer 470.

The data buffer 470 has the same function as the data buffer 140, and stores data transferred through the output gate 460 and outputs this data.

The output gate 480 has the same function as the output gate 230, and receives an enable signal output from the control section 450 in response to a high level coincidence signal output when the address comparator 220 detects coincidence, and outputs data stored in the data buffer 470 to the input output port 80. That is, when a low level enable signal output from the control section 450 is received while the address comparator 220 is detecting lack of coincidence, the output gate 480 does not output data stored in the data buffer 470. The enable signal output from the output gate 480 is the same as the enable signal input to the output gate 230.

The data monitoring circuit 400 of the fourth embodiment comprises a first address storage circuit comprised of a plurality (in order to simplify the specification, two in FIG. 4) of duplicate storage sections (data memory address buffers 110, 410), and accompanying these storage sections there are also plurally provided (according to the number of duplicate storage sections) a first comparison circuit (address comparators 120, 420), a first gate circuit (output gates 130, 460), a first data storage circuit (data buffers 140, 470), and a second gate circuit (output gates 230, 480). As a result, it is possible to set a number of different items of address information to be monitored for the data storage memory.

The operation of the data monitoring circuit 400 having this type of construction will be described below.

When the microcomputer is operating normally, the test signal is low level and the data memory address buffers 110 and 410 are not storing address information to be monitored (or, invalid address information that is not designated during normal operation) is stored. As a result, similarly to the second embodiment, data transfer from the output gate 130 to the data buffer 140 and data transfer from the output gate 460 to the data buffer 470 is not carried out, and there is no transfer of data of the data buffer 140 from the output gate 230 to the input output port 20, and no transfer of data of the data buffer 470 from the output gate 480 to the input output port 80. It is possible for the input output ports 10, 20, 50, 70 and 80 to send and receive data during normal operation without being affected by the data monitoring circuit 400. At this time, the completion flag also remains at "0", and the information of the data buffer valid flag section 440 remains unchanged at "00". Accordingly, even if a terminal for indicating the flag condition of the completion flag section 160 and the information of the data buffer valid flag section 440 is at the input output port, there is no problem since sending and receiving of signals at that input output port is given priority.

Next, description will be given for the case where the condition of specified address values of locations in the memory for storing data is monitored in order to analyze defects when a specified process is executed.

The test signal T is set to high level, one item of address information of a memory cell that is desired to be monitored is input from the input output port 10, and this address information is stored in the data memory address buffer 110. Similarly, another one item of address information of a memory cell that is desired to be monitored is input from the input output port 70 and this address information is stored in the data memory address buffer 410. Similarly, under the condition that a specified process is being executed, address information of the program storage memory where the specified process is stored is input from the input output port 50, and this address information is stored in the program memory address buffer 210. At this time, the completion flag section 160 is also reset to the initial condition of "0" and the information of the data buffer valid flag section 440 is reset to "00".

In this state, the test signal T is returned to low level, and similarly to the normal operation an internal program is caused to execute and the microcomputer is operated. With progression of the program, data is read from and written to the data storage memory which is the subject of monitoring. At this time, when reading or writing is carried out to or from the memory for storing data, address information is transferred via a bus, and the address comparator 120 compares this address information being transferred with address information stored in the data memory address buffer 110, and the address comparator 420 compares the address information being transferred with the address information stored in the data memory address buffer 410. Similarly, comparison of address information indicated by the program counter 60 and address information stored in the program memory address buffer 210 is carried out in the address comparator 220.

In these comparisons, when the address comparator 120 (or the address comparator 420) detects coincidence of address information a high level coincidence signal is output. The controller 350 sets an enable signal for the output gate 130 (or 460) to high level in response to the high level coincidence signal. In response to the enable signal going high level, the output gate 130 (or 460) transfers data that has been transferred to the bus and written to the data storage memory (or data that has been read) to the data buffer 140 (or 470), based on the coincident address information. However, when the address comparator 220 is not detecting coincidence of address information, a high level enable signal making it possible for the output gates 230 and 480 to transfer data is not supplied from the control section 250 (that is, the enable signal supplied to the output gates 230 and 480 remains at a low level). As a result, data stored in the data buffer 140 (or 470) is not output to the input output port 20 (or 80). The completion flag section 160 also maintains the flag at "0" and the data buffer valid flag section remains at "00". That is, unless the address comparator 220 detects coincidence, the contents of the data buffer 140 (or 470) are updated each time the address comparator 120 (or 420) detects coincidence.

Next, if the address comparator 220 has detected coincidence of address information, a high level coincidence signal is output. The control section 450 sets an enable signal for the output gates 230 and 480 to a high level in response to the high level coincidence signal. In response to this enable signal, the output gates 230 and 480 respectively output data stored in the data buffers 140 and 470 at this time to the input output ports 20 and 80. At this time, the control section 450 sets the flag for the completion flag section 160 to "1" in response to the coincidence signals of the three address comparators 120, 420 and 220 respectively becoming high level.

If the address comparator 120 has already detected coincidence and the address comparator 420 has not detected coincidence even once before the address comparator 220 detects coincidence, the information of the data buffer valid flag section 440 becomes "01". If the address comparator 420 has also already detected coincidence and the address comparator 120 has not detected coincidence even once before the address comparator 220 detects coincidence, the information of the data buffer valid flag section 440 becomes "10". If the address comparators 120 and 420 have already detected coincidence before the address comparator 220 detects coincidence, the information of the data buffer valid flag section 440 becomes "11". The function of this data buffer valid flag section 440 can also be incorporated into the completion flag section 160.

In this way, with the data monitoring circuit 400 of the fourth embodiment, until a specified process is carried out, it is possible to output data that has been written to or read from a number of specified address information of a memory to be monitored, and so higher speed defect analysis can be carried out. Accordingly, defect analysis can be carried out more reliably and in a shorter time.

Also, compared to the second embodiment, there is no significant addition to the construction and no complicated control, which means that there is no increase in chip size.

Using the data buffer valid flag section 440, it is possible to immediately know what state the information output from the input output ports 20 and 80 is in.

A detailed description has been given above, but the data monitor circuit of present invention is not limited to the structure of the embodiments. For example, the data memory address buffer and program memory address buffer etc., are not limited in number to those described in the embodiments above. Also, the inputs and outputs to each of the buffers have been described using input output ports, but it goes without saying that inputs and outputs can be connected at other terminals. The data monitor circuit of the present invention has been described as being built into a microcomputer, but an external device can also be used as long as the same operation as the data monitor circuit of the present invention is possible. Also, it goes without saying that the data storage memory that is the subject of monitoring is required to at least read data. Also, it is possible to apply a combination of the features of each of the embodiments (for example, a data monitor circuit having the respective features of the third embodiment and the fourth embodiment).

What is claimed is:

1. A data monitoring circuit for monitoring data transferred on a bus when at least reading of data from a first memory circuit is carried out via the bus according to a specified program, comprising:

a first address storage circuit for storing address information of said memory circuit to be monitored;

a first comparison circuit for receiving address information designated by said specified program via the bus and detecting coincidence with address information stored in said first address storage circuit;

a first data storage circuit for storing data transferred on the bus;

a first gate circuit for transferring data being transferred to the bus to said first data storage circuit in response to a first permission signal; and a control circuit for outputting said first permission signal according to a detection result of said first comparison circuit.

2. The data monitoring circuit as disclosed in claim 1, wherein said control circuit outputs said first permission signal and outputs indication information indicating a detection result of said first comparison circuit, and the data monitor circuit has an indication information storage circuit for storing and outputting the indication information.

3. The data monitoring circuit as disclosed in claim 1, wherein said fixed program is stored in a second memory circuit, the data monitor circuit has a second address storage circuit, for storing address information to be monitored, a second comparison circuit, for detecting coincidence between address information indicated by a program counter for the specific program and address information stored in said second address storage circuit, and a second gate circuit for externally outputting data stored in said first data storage circuit, and said control circuit outputs a second permission signal according to a detection result of said second comparison circuit.

4. The data monitoring circuit as disclosed in claim 3, wherein said second address storage circuit has n (where n is a multiple greater than or equal to 2) duplicate storage sections for storing plural address information to be monitored, and said data monitor circuit has a first selector circuit and a second selector circuit, and wherein said address information to be monitored is stored in order from a highest priority address from said first duplicate storage section to said nth duplicate storage section using said first selector circuit, and address information to be monitored is transferred from said duplicate storage sections to said second comparison circuit in order from the highest priority address using said second selector circuit.

5. The data monitoring circuit as disclosed in claim 4, wherein said second selector circuit switches address information stored in said duplicate storage section for transfer to said second comparison circuit in response to a detection result of said second comparison circuit.

6. The data monitoring circuit as disclosed in claim 3, wherein said first address storage circuit has n (where n is a multiple greater than or equal to 2) duplicate storage sections for storing plural address information to be monitored, said first comparison circuit has n comparison circuits for respectively comparing address information stored in said n duplicate storage sections and address information transferred on a bus, said first permission signal is made up of n permission signals corresponding to detection results from said n comparison sections, said first data storage section has n duplicate storage sections, said first gate circuit and said second gate circuit have n duplicate gate sections respectively corresponding to said n duplicate storage sections of said first data storage section, said n duplicate gate sections of said first gate circuit transfer data transferred to said bus in response to one of the respective n permission signals to a corresponding one of said n duplicate storage sections of the first data storage section, and said n duplicate gate sections of said second gate circuit externally output data stored in said first data storage circuit in response to said second permission signal.

7. The data monitoring circuit as disclosed in claim 3, wherein said control circuit outputs a second permission signal, and outputs indication information indicating a detection result of said second comparison circuit, and said data monitor circuit has an indication information storage section for storing and outputting said indication information.

8. The data monitoring circuit as disclosed in claim 4, wherein the control circuit outputs a second permission signal, and outputs indication information indicating a detection result of said second comparison circuit, and said data monitor circuit has an indication information storage section for storing and outputting said indication information.

9. The data monitoring circuit as disclosed in claim 5, wherein said control circuit outputs a second permission signal, and outputs indication information indicating a detection result of said second comparison circuit, and said data monitor circuit has an indication information storage section for storing and outputting said indication information.

10. The data monitoring circuit as disclosed in claim 6, wherein the control circuit outputs a second permission signal, and outputs indication information indicating a detection result of said second comparison circuit, and said data monitor circuit has an indication information storage section for storing and outputting said indication information.

\* \* \* \* \*